（12）United States Patent
Peckerar et al.

(10) Patent No.: US 8,054,450 B2
(45) Date of Patent: Nov. 8, 2011

(54) STEPPER SYSTEM FOR ULTRA-HIGH RESOLUTION PHOTOLITHOGRAPHY USING PHOTOLITHOGRAPHIC MASK EXHIBITING ENHANCED LIGHT TRANSMISSION DUE TO UTILIZING SUB-WAVELENGTH APERTURE ARRAYS

(75) Inventors: Martin C. Peckerar, Silver Spring, MD (US); Mario Dagenais, Chevy Chase, MD (US); Birendra Dutt, Westchester, CA (US); John D. Barry, College Park, MD (US); Michael D. Messina, Jr., Southport, CT (US); Yves Ngu, Greenbelt, MD (US)

(73) Assignee: University of Maryland, College Park, MD (US)

( * ) Notice: Subject to any disclaimer, the term of this patent is extended or adjusted under 35 U.S.C. 154(b) by 588 days.

(21) Appl. No.: 12/114,409

(22) Filed: May 2, 2008

(65) Prior Publication Data

US 2009/0201475 A1 Aug. 13, 2009

Related U.S. Application Data

(60) Provisional application No. 60/924,179, filed on May 2, 2007.

(51) Int. Cl.
*G03B 27/52* (2006.01)

(52) U.S. Cl. .................................. 355/55; 355/53; 430/5

(58) Field of Classification Search .................... 355/55; 430/5
See application file for complete search history.

(56) References Cited

U.S. PATENT DOCUMENTS

2005/0024610 A1* 2/2005 Nishi et al. ....................... 355/53

OTHER PUBLICATIONS

Srituravanich, et al. "Deep subwavelength nanolithography using localized surface plasmon modes of planar silver mask" J. Vac. Sci. Technol. B 23(6), Dec. 2005, p. 2636-2639.*
T.W. Ebbesen et al., "Extraordinary optical transmission through sub-wavelength hole arrays", Nature, vol. 391, Feb. 1998, pp. 667-669.

* cited by examiner

*Primary Examiner* — Edward Glick
*Assistant Examiner* — Mesfin T Asfaw
(74) *Attorney, Agent, or Firm* — Rosenberg, Klein & Lee

(57) ABSTRACT

A stepper system for ultra-high resolution nano-lithography employs a photolithographic mask which includes a layer of an electrically conductive optically opaque material in which periodic arrays of sub-wavelength apertures are formed. The plasmonic excitation in the photolithographic mask exposed to the light of the wavelength in the range of 197 nm-248 nm, produces high resolution far-field radiation patterns of sufficient intensity to expose a photoresist on a wafer. The stepper system demonstrates the resiliency to the mask defects and ability to imprint coherent clear features of nano dimensions (45 nm-500 nm) and various shapes on the wafers for integrated circuits design. The stepper system may be adjusted to image the plane of the highest plasmonic field exiting the mask.

19 Claims, 12 Drawing Sheets

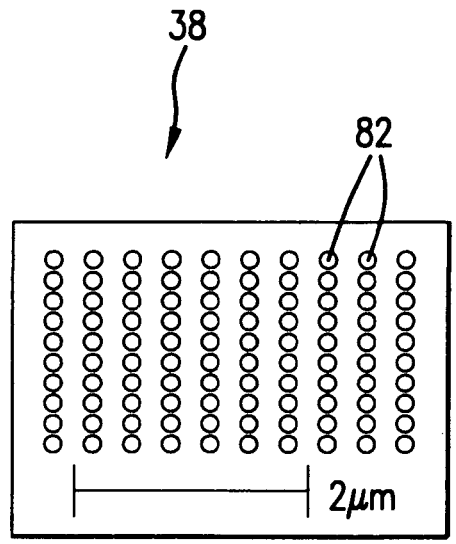
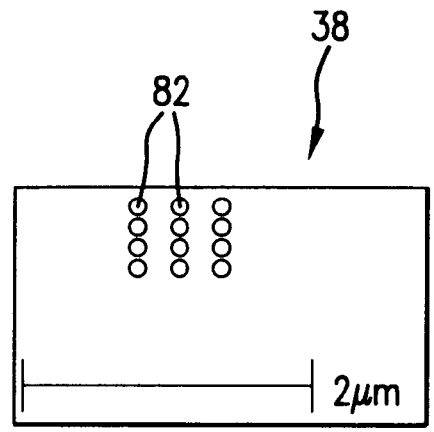
FIG.7A  FIG.7B
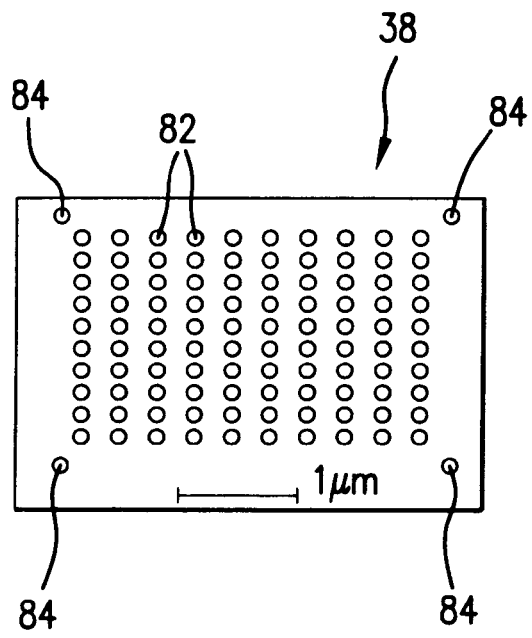
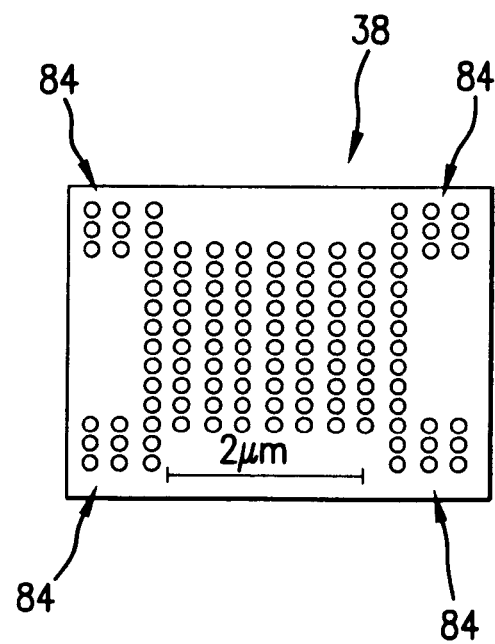
FIG.7C  FIG.7D

FEATURE SIZE OPTIMIZATION APPROACH

STEPPER SYSTEM FOR ULTRA-HIGH RESOLUTION PHOTOLITHOGRAPHY USING PHOTOLITHOGRAPHIC MASK EXHIBITING ENHANCED LIGHT TRANSMISSION DUE TO UTILIZING SUB-WAVELENGTH APERTURE ARRAYS

STATEMENT REGARDING FEDERALLY SPONSORED RESEARCH OR DEVELOPMENT

The development of the invention described herein was funded by the U.S. Naval and Air Systems Command (NAVAIR) under Grant Number N004210310002. The U.S. Government has certain rights in this invention.

This utility patent application is based on the Provisional Patent Application Ser. No. 60/924,179 filed 2 May 2007.

FIELD OF THE INVENTION

The present invention relates to photolithography, and in particular to an ultra-high resolution nano-lithographic system for "imprinting" nano-sized features on a substrate (wafer).

More in particular, the present invention relates to a stepper system utilizing photolithographic masks, e.g., metal films perforated with regular arrays of sub-wavelength apertures in which plasmonic excitation is generated to produce high resolution far-field radiation patterns of sufficient intensity to expose photoresist when propagated through an optical system in photolithographic printing.

Additionally, the present invention is directed to a photolithographic system using photolithographic mask fabricated in an efficient manner with a reduced mask "writing time".

The present invention further relates to a stepper system for ultra-high resolution photolithography which employs a defects resilient photolithographic mask where defects in the photolithographic mask have a minimal or no impact on the quality of a projected image on a wafer.

BACKGROUND OF THE INVENTION

A stepper is a device utilized in fabrication of integrated circuits. Steppers play an essential role in a photolithographic process where microscopic and nano-sized circuit elements are created on wafers.

In the photolithographic process, elements of the circuit to be created on the wafer are reproduced in a pattern of transparent and opaque areas formed on a surface of a photomask. The stepper passes light through the mask to form an image of the mask pattern on the wafer. Usually, the image is focused and reduced by a lens of the stepper. The image is then projected onto the surface of the wafer which is coated with a photoresist.

After exposure in the stepper, the coated wafer is developed in the manner of photographic film, causing portions of the photoresist to dissolve in certain areas in accordance to the exposure dose in the areas receiving light. The areas of the photoresist and no photoresist reproduce a pattern on the mask. The developed wafer is then exposed to an etching process as is known to those skilled in the art.

Photo-masks which are used in the steppers play a large role as to the quality of the images which are to be printed on the wafers.

Referring to FIG. 1, a conventional stepper 10 includes a wafer stage 12 with a wafer 14 attached thereto, an illumination system 16, a mask 18, and an optical system 20 which includes a condenser lens 22 between the light source and the mask, and a projection (reduction) lens 24 between the mask and the wafer.

As it is seen in FIGS. 1 and 2, the conventional stepper 10 uses a conventional mask 18 which has a continuous clear region 26 formed in an opaque mask plate 28. The clear region 26 of the conventional mask is formed at a location, and sized as well as shaped to permit "imprinting" of a micro- or nano-feature on a substrate (wafer) as is conventional in photolithography. In order to "write" a pattern, e.g. the continuous clear region 26, on the mask 18, a focused ion beam or electron beam (not shown) is scanned over the opaque mask plate addressing all pixels corresponding to the clear region. In this mask, the fill-factor, e.g. the ratio of the clear-to-opaque area may be quite large. The necessity to expose all pixels of the opaque mask plate corresponding to the clear region requires a lengthy writing process for the conventional mask. Therefore, it would be highly desirable to reduce the "writing time" in the mask fabrication.

The interaction between light and a hole in an opaque screen has been the object of curiosity in technology application for centuries. Grimaldi (F. M. Grimaldi, Physico-Mathesis De Lumine, Coloribus, et Iride, 9, 1665) first described diffraction from a circular aperture thereby providing an experimental basis for classical wave optics in the $17^{th}$ century. Conventional diffraction theory of light transmission through a sub-wavelength aperture predicts a strongly attenuated transmitted beam (H. A. Bethe, Phys. Rev. 66, 163, 1944; T. W. Ebbesen, et al., Nature (London) 391, 667, 1998).

However, an interesting transmission phenomenon is seen to take place when light interacts with an array of sub-wavelength apertures in an opaque metal sheet. In 1998, Ebbesen, et al. made the observation of transmission efficiency from sub-wavelength circular apertures which was orders of magnitude greater than predicted by a standard aperture theory. Experiments provided evidence that the unusual optical property was due to the coupling of light with plasmons on the surface of the periodically patterned metal film. It was also observed that arrays of such holes display highly unusual zero-order transmission spectra at wavelengths larger than the array period beyond which no diffraction occurs. In addition, sharp peaks in transmission were observed at wavelengths as large as 10 times the diameter of the cylindrical apertures.

It is believed that light incident on a metal thin film establishes oscillations in the mobile charge density (ripples in the "Fermi sea"). These ripples, or plasmon excitations in the metal foil give rise to an evanescent mode of re-radiation that has been used in the past for contact printing. In addition, the ripples also excite the cavity modes of circular apertures in the thin film. These cavity modes act as intense light sources propagating into the far-field, drawing energy from their surroundings on which light is incident. The net transmission is far greater than the aperture area would dictate if taken alone.

It would be highly desirable to apply the plasmonic effect and extraordinary transmission phenomenon of the light interaction with an array of sub-wavelength holes formed in an opaque metal sheet to provide inexpensive stepper for an ultra-high resolution sub-wavelength lithographic system for fabrication of semiconductor integrated circuits, data storage, as well as in microscopy, bio-photonics, etc.

SUMMARY OF THE INVENTION

It is an object of the present invention to provide a stepper for the ultra-high resolution sub-wavelength lithographic system which uses a photolithographic mask exhibiting enhanced light transmission due to the plasmonic excitation of the incident light in sub-wavelength apertures formed in an array formed in the mask to collect and re-radiate optical energy suitable for imaging nano patterns in ultra-high resolution photolithographic printing.

It is another object of the present invention to provide a stepper utilizing a photolithographic mask having periodic arrays of sub-wavelength apertures formed in a metal film in which the fill-factor (ratio of clear-to-opaque area of the mask) is significantly reduced resulting in the reduced "writing time" of the mask, and consequently, in decreased cost of fabrication and increased mask fabrication throughput when using direct-write technologies.

It is a further object of the present invention to provide a stepper using a photolithographic mask having arrays of sub-wavelength apertures formed in the opaque electrically conducting surface coating of the mask for effectively coupling the illuminating light with the mask surface in a manner as to excite surface plasmons of wavelengths smaller than that of the incident light in the ultra-high resolution lithography.

Another object of the present invention is to provide a stepper integrated with a photolithographical mask having aperture arrays defining pattern areas on the mask plate for ultrahigh resolution photolithographic printing where a collective optical excitation propagates into the far-field with sufficient intensity onto a photoresist on a substrate to attain a continuous well defined image imprinted in the photoresist.

It is another object of the present invention to provide a stepper integrated with a photolithography mask which is defect resilient, e.g., where the absence of one or a few apertures in arrays thereof does not seriously degrade the far-field pattern (image) created by the collective scattering from the sub-wavelength apertures array, and where image imprinted on the photoresist (wafer) exhibits satisfactory edge acuity and robustness against the normally encountered mask defects.

It is an additional object of the present invention to provide a stepper utilizing a photolithographic mask amenable to obtain dimensions of the projected image (features on the photoresist or wafer) smaller than the wavelength of the illuminating light, and where the exposure dose needed for imprinting of the features on the wafer, is attained in a shorter time due to enhanced transmission of the light through the periodic arrays of apertures formed in the mask.

The present invention constitutes a stepper integrated with photolithographic masks suitable for use in nano-lithography, where each photolithographic mask is positioned in a predetermined relationship with a wafer and is illuminated by a radiation (light) to imprint at least one feature on the wafer in correspondence with a pattern "written" on the photolithographic mask.

The stepper includes a wafer stage carrying thereon a wafer covered with a photoresist layer, an optical system positioned between the source of the light and the wafer, a wafer alignment system, a mask alignment system, and a control unit operatively coupled to the illumination system of the stepper, the mask (mask stage), and the wafer stage. The control unit controls the operation of the stepper in accordance with a predetermined process program.

The light of a predetermined wavelength $\lambda_1$ and intensity is directed through a condenser lens to the mask and passes through the array of apertures formed therein. Due to the plasmonic excitation in the periodic electrically conductive structure of the mask, the collective intensity of the light exciting the mask's apertures having a wavelength $\lambda_2$ and propagating towards the photoresist on the wafer is of a sufficient magnitude to expose the photoresist in accordance to the mask pattern. Due to the increased intensity of the light exiting the mask's apertures and incident on the photoresist it is possible to shorten the exposure time for each "shot", thereby leading to a reduction in the photolithographic process time. Additionally, it is possible to control the size and quality of the imprinted features by controlling size of the apertures in the arrays on the mask, spacing therebetween, as well as the exposure dose.

The photolithographic mask in the stepper includes a photo-plate formed as a layer of an electrically conducting optically opaque material (preferably, Ag, Al, or Cr) on an optically transparent material, for example, glass (preferably quartz). At least one pattern area is defined at a predetermined location of the photo-plate. The pattern area includes a periodic array of apertures of a predetermined size, perforated through the layer of the opaque material of the photo-plate. The apertures are spread out over the pattern area in a predetermined order and spaced each from the other by a predetermined distance. The size, spacing distance, the order of positioning the apertures, as well as the illumination dose, determine the parameters of the micro- and nano-features to be imprinted on a wafer (photoresist). The characteristics of the photolithographic mask, as well as the excitation dose of the light are optimized for each particular circuitry feature to be imprinted on the wafer. It is important that the size of the apertures is in the range of sub-wavelength, e.g., smaller than the wavelength of the incident radiation.

Masks with any number of pattern areas may be used in the stepper depending on the design of the circuit to be created at the wafer of interest. The characteristics of the aperture arrays in each pattern area of the mask may be independent one from the other, or may correspond to each to the other, e.g., the size of the apertures, size and shape of the array, spacing between apertures, etc. may be chosen to be identical or distinct in respective pattern areas on the mask.

The mask may have correctional holes formed at the corners of the aperture arrays to improve the shape of the features to be imprinted on the wafer. Preferably the correctional holes at the corners of the aperture arrays are arranged in a matrix, for example 3×3 matrix in order to "square" the corners of the printed features.

The stepper using the photolithographic mask with arrays of apertures is less expensive than conventional ones due to the reduced "writing" time of the mask. The mask which has sub-wavelength aperture arrays may be fabricated by any "writing" technique including, for example, Focused Ion Beam where the focused beam of predetermined intensity is aligned with a location of each aperture to be formed and mills through the mask plate. Increased throughput for the mask fabrication and significant fabrication savings may be obtained even when using direct-write technologies because it is necessary to mill through the film only at a small number of sites within a pattern area rather than milling the entire area of the pattern feature on the mask. This is also referred to as a reduced "fill-factor" and leads to reduced "writing time".

The layout of the mask employed in the stepper of the present invention may be controlled for optimizing apertures size, spacing, array shape, etc., for attaining the optimized printing conditions for creating a particular integrated circuit on the wafer. These mask parameters are optimized for each particular feature (circuit design) to be imprinted on the wafer in correlation with the illumination dose and wavelength of the incident light, as well as in correspondence with the material of the mask photo-plate.

In the stepper, the optical system, e.g., optical filters and source collimators, may be adjusted to achieve maximum benefit from the plasmonic sub-wavelength aperture mask embedded in the stepper. For example, it is contemplated that in the stepper in order to image the plane of the maximum plasmonic excitation, the position of the optical collimator and reduction lens between the mask and the wafer may be adjusted. Additionally, the depth-of-focus of the stepper may be increased to attain the high quality of the features imprinted on the wafer.

A broadband mercury light source may be used with a narrowband optical filter for the stepper's illumination system for attaining 248 nm wavelength of the incident light. The photoresist deposited on the surface of the wafer may be preferably chosen with the highest sensitivity to the wavelength $\lambda$ of the created plasmonic field at the mask in question. It is contemplated that the photoresist is covered on the wafer by spinning to attain the photoresist thickness in the range of 25%, 50%, or 75% of the plasmonic field distribution depth exiting the sub-wavelength apertures of the plasmonic mask.

The present invention also constitutes a method of manufacturing integrated circuits in the ultra-high resolution photolithography by employing a stepper integrated with a photolithographic mask exhibiting enhanced light transmission due to the use of arrays having sub-wavelength apertures.

The method for imaging features on a wafer in the nanolithography stepper system of the present invention, comprises the steps of:

generating light having a wavelength $\lambda$;

installing a photolithographic mask in the stepper system, where the photolithographic mask includes a layer of an electrically conducting optically opaque material perforated to form at least one array of apertures extending through the layer and having a diameter d<$\lambda$. Such an array defines at least one pattern area on said photolithographic mask;

exposing a front side of the mask to the light of the wavelength $\lambda$, thereby producing far-field radiation at a back side of the photolithographic mask;

exposing a photoresist on the wafer to said far-field radiation exiting the mask of a sufficient intensity to expose the photoresist in accordance with the pattern area on the mask.

It is preferred that the photoresist has a sufficient sensitivity to the wavelength of the plasmonic radiation exiting the aperture arrays, and that the thickness of said photoresist layer ranges between 25% and 75% of the plasmonic excitation field depth.

A first optical unit is positioned between the photolithographic mask and the photoresist, and a second optical unit between the light source and the mask. As a part of the optimization of the stepper system, it is contemplated that the positions of the first and second optical units with relation to the mask and wafer are controlled to increase a depth-of-focus of the stepper system as well as imaging a plane of a maximum plasmonic excitation field of the mask onto the photoresist.

These and other features and advantages of the present invention will be understood after reading a further description of the preferred embodiment in conjunction with the patent drawings.

BRIEF DESCRIPTION OF THE DRAWINGS

FIGS. 7A-7D are SEM (Scanning Electron Microscope) images of alternative embodiments of the masks used in the stepper of the present invention;

DESCRIPTION OF THE PREFERRED EMBODIMENTS

Figure 1:
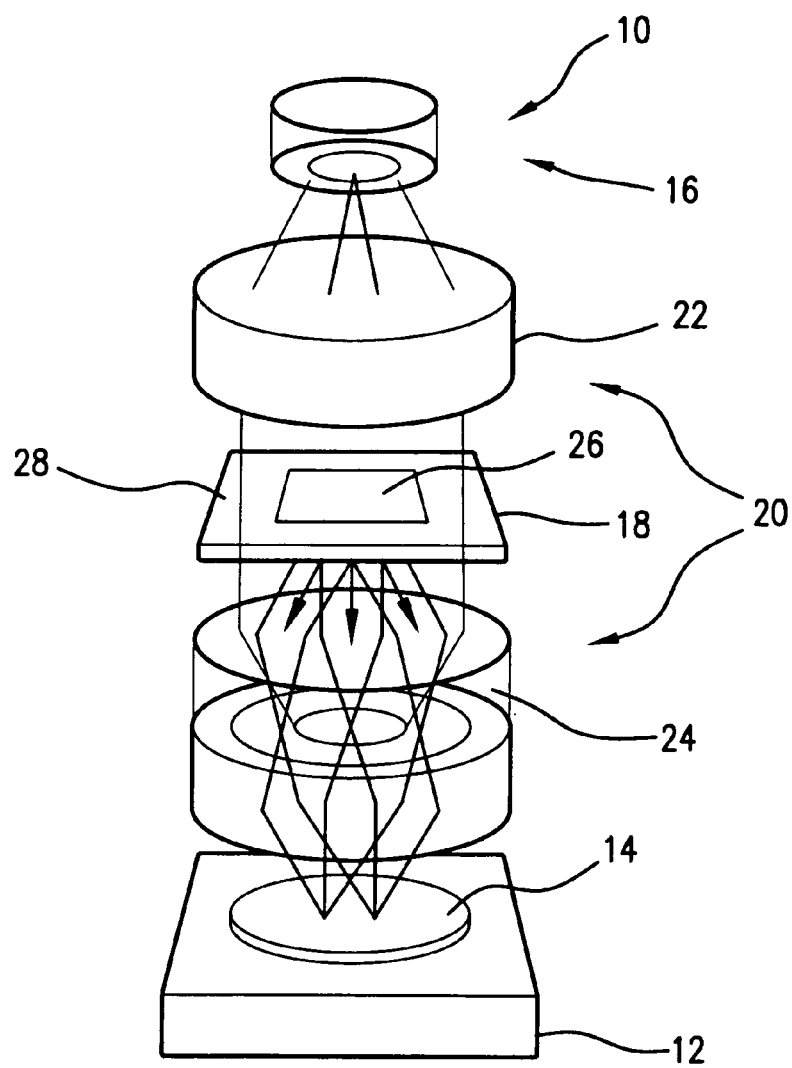
FIG. 1 is a schematic representation of a prior art stepper.
Figure 2:
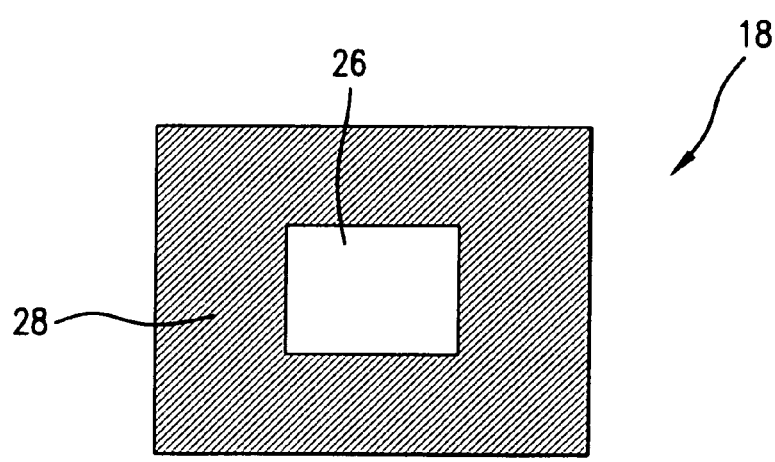
FIG. 2 is a schematic representation of a prior art photolithographic mask used in conventional steppers.
Figure 3:
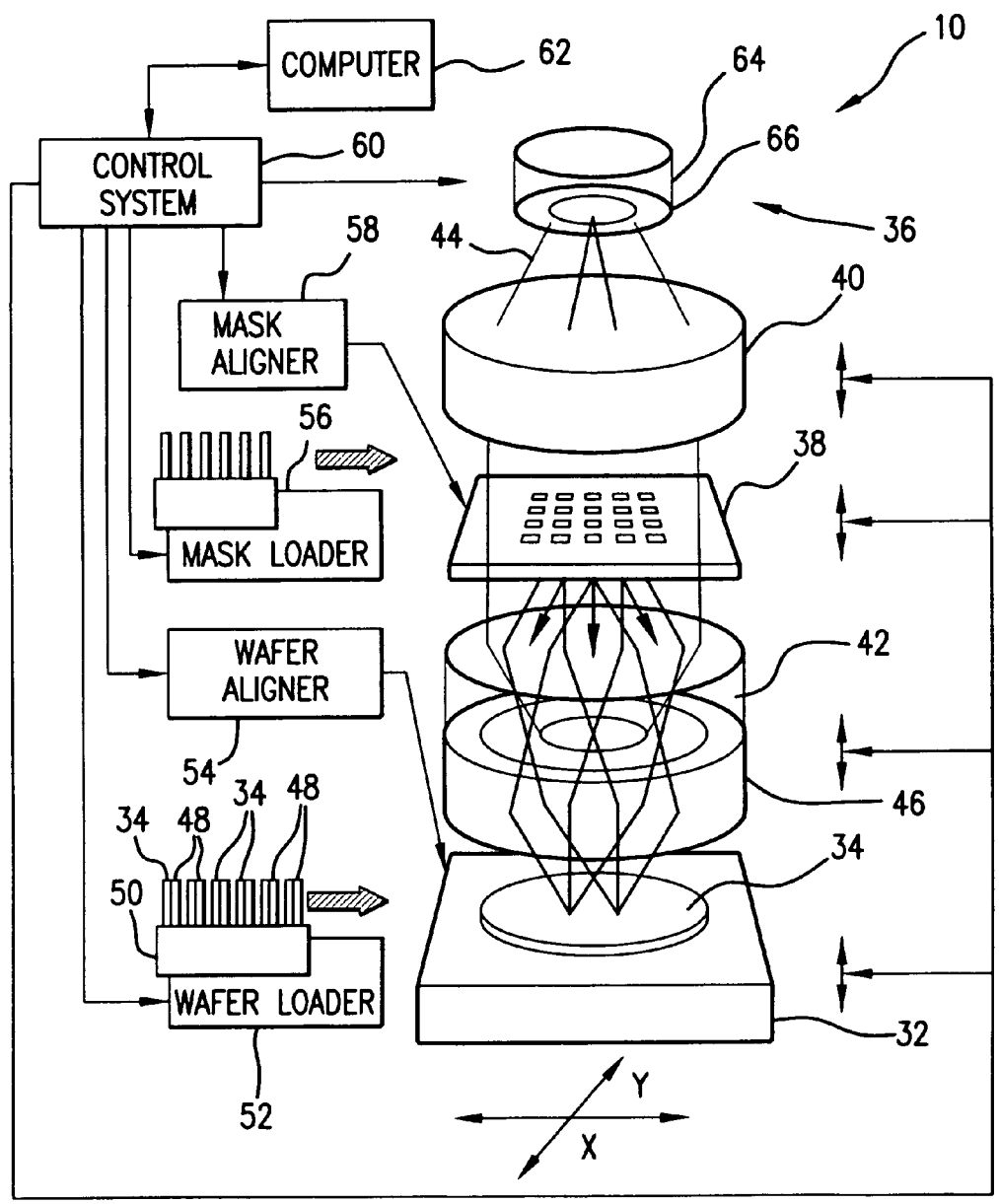
FIG. 3 is a schematic representation of the stepper system of the present invention.

Referring to FIG. 3, a stepper 30 of the present invention includes a wafer stage 32 with a wafer 34 secured to it, an illumination system 36, a mask 38 positioned between the illumination system and the wafer 34, and an optical system which includes a condenser lens 40 positioned between the illumination system 36 and the mask 38, and a projection (reduction) lens 42 positioned between the mask 38 and the wafer 34. The stepper 30 passes light 44 of a wavelength $\lambda_1$ from the illumination system through the mask 38 to form an image of the mask pattern.

Figure 3A:
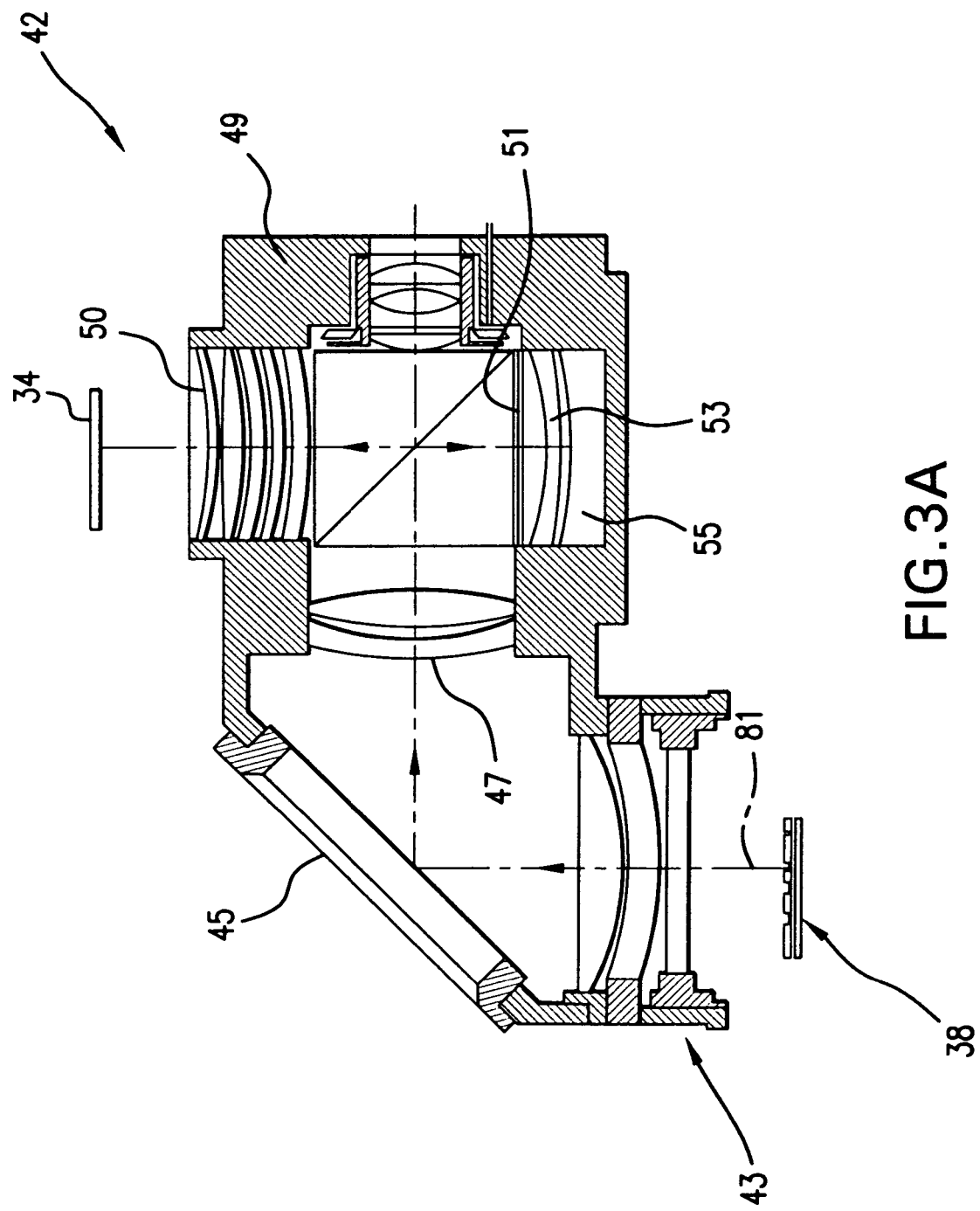
FIG. 3A is a schematic representation of the projection optics of the stepper shown in FIG. 3.

The image is focused and reduced by the projection optics 42 and the aperture (pupil) 46 which is presented more in detail in FIG. 3A. The image is then projected onto the surface of the wafer 34 covered by a photoresist 48. When the wafer is processed in the stepper, the pattern formed in the mask 38 (which may contain a number of individual chip patterns) is exposed repeatedly across the surface of the wafer in a grid. The stepper moves or "steps" the wafer from one "shot" location to another. This is accomplished by moving the wafer stage 32 back and forth, as well as left and right, under the projection optics 42 of the stepper as well as by controlling the projection optics 42 itself.

The stepper equipment can be used to expose the entire wafer to the mask at once. However the stepper, working on a limited area, is capable of higher resolution. Additionally, in the stepper 30, the wafer 32 and the mask 38 may be displaced with respect to each other during the exposure. This provides a way of increasing the size of the exposed area and increasing the imaging performance of the projection optics 42.

Referring to FIG. 3A, the projection optics 42 includes triplet lens 43, through which the radiation 81 from the mask 38 passes to a diachromic mirror 45. The light is reflected by the mirror 45 and propagates further through a lens doublet system 47 onto a polarizing beamsplitter 49. After splitting in the beamsplitter 49, a portion of the light propagates through a λ/4 plate 51 and through a singlet lens 53 onto an aspheric mirror 55. The light further reflects from the mirror 55 towards the wafer 34 which is selected from the wafer cassette 50, as will be detailed in following paragraphs.

A plurality of wafers coated with a photoresist layer may be placed in a cassette or "boat" 50 which holds a number of wafers. The cassette is placed in a wafer loader 52 which may be located at the lower front of the stepper. A robot (not shown) in the wafer loader picks up one of the wafers from the cassette and loads it onto the wafer stage 32 where it is aligned to enable a further, finer alignment process, that will occur at the later stages of the stepper operation. The function of the initial alignment of the wafer, as well of the finer alignment, is performed by a wafer aligner 54.

The pattern of the circuitry for each chip is contained in a pattern etched in the metal optically opaque mask plate on the mask. The mask 38 which is used in the stepper 30 may be a 6×6 inches square with a useable area of 104 mm×132 mm square.

A variety of masks, each appropriate for one stage in the process, may be contained in a rack in the mask loader 56. Prior to exposure of the wafer, an appropriate mask 38 is loaded onto the mask stage (not shown) by a robot (not shown) where it is precisely aligned by the mask aligner 58. Since the same mask may be used to expose a number of wafers, it is loaded once before a series of wafers is exposed, and is realigned periodically.

Once the wafer and mask are in place and aligned, the wafer stage 32 is moved precisely in the X and Y direction by any mechanism known to those skilled in the art, including for example worm screws or linear motors, so that the first of the many patterns (or "shots") to be exposed is located below the lens 42 directly under the mask 38.

Although the wafer 34 is aligned immediately after it is placed on the wafer stage 32, this alignment is not sufficient to insure that the layer of circuitry to be "printed" on the wafer is in exact overlay alignment with previous layers already exposed. Therefore, each "shot" needs to be aligned using special alignment marks that are located in the pattern for each final IC chip. Once the fine alignment is completed by the wafer aligner 54, the current "shot" is exposed by the light emanating from the illumination system 36 that passes through the mask 38, through the reduction lens 52, and on the surface of the wafer 34. A process program, or recipe, in the control system 60 determines the length of the exposure, the mask used, as well as other factors that affect the exposure.

Each "shot" located in a grid pattern on the wafer 34 is exposed in turn as the wafer is bi-directionally translated under the projection lens 42. When all "shots" on the wafer are exposed, the wafer is unloaded by the wafer loader robot, and another wafer takes its place on the wafer stage. The exposed wafer is eventually moved to a developer where the photoresist on its surface is exposed to developing chemicals that wash away areas of photoresist based on whether or not they were exposed to the light passing through the mask. The developed surface is then subjected to other well known processes of photolithography.

Process programs for each layer printed on the wafer are executed by the control system 60 coupled to a computer 62 which stores the process program, reads it, and communicates with the various subassemblies of the stepper 30 in carrying out the program(s) instructions.

The components of the stepper 30 are contained in a sealed chamber (not shown) that is maintained at a predetermined temperature to prevent distortions in the printed patterns that may be caused by expansion or contraction of the wafer due to temperature variation. The chamber also may contain other systems which support the photolithographic process, such as for example air conditioner, power supplies, control boards for the various electrical components, and others.

The ability of an exposure system, such as a stepper, to form micro- and nano-features is limited by the wavelength of the light used for illumination, the ability of the lens to capture light coming in at increasingly wider angles (numerical aperture), and various improvements in the process itself. As the features of integrated circuits become smaller, illumination sources producing light with progressively shorter wavelength are needed in steppers.

In the present stepper 30, it is preferable that a broadband mercury light source 64 is used in combination with narrow band optical filter 66 to produce a light 44 with a wavelength in the range of 197 nm-248 nm. As an alternative, the illumination system may also include krypton—fluoride (KRF) Excimer lasers producing 248 nm light, or argon—fluoride (ARF) Excimer lasers that emits light with a wavelength of 193 nm. These fluoride lasers however, although available to produce short wavelength, are not practical due to their low power and quick degradation of the materials used to make the lenses in the stepper subjected to such a radiation.

Figure 4:
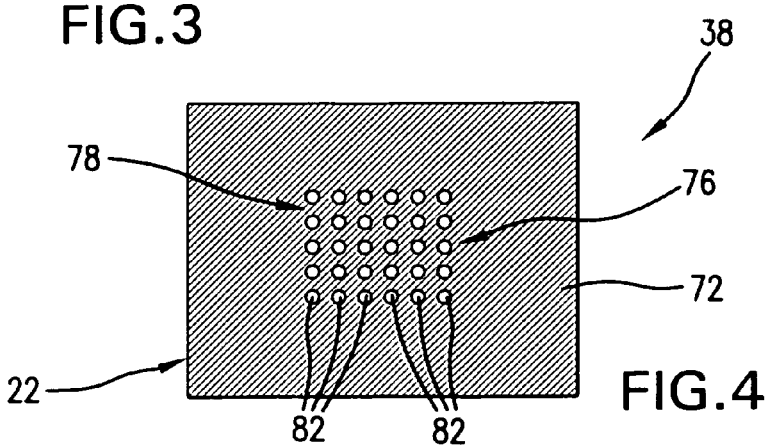
FIG. 4 is a schematic representation of the mask employed in the stepper system of the present invention showing an array aperture formed in a pattern area of the mask photoplate.
Figure 5:
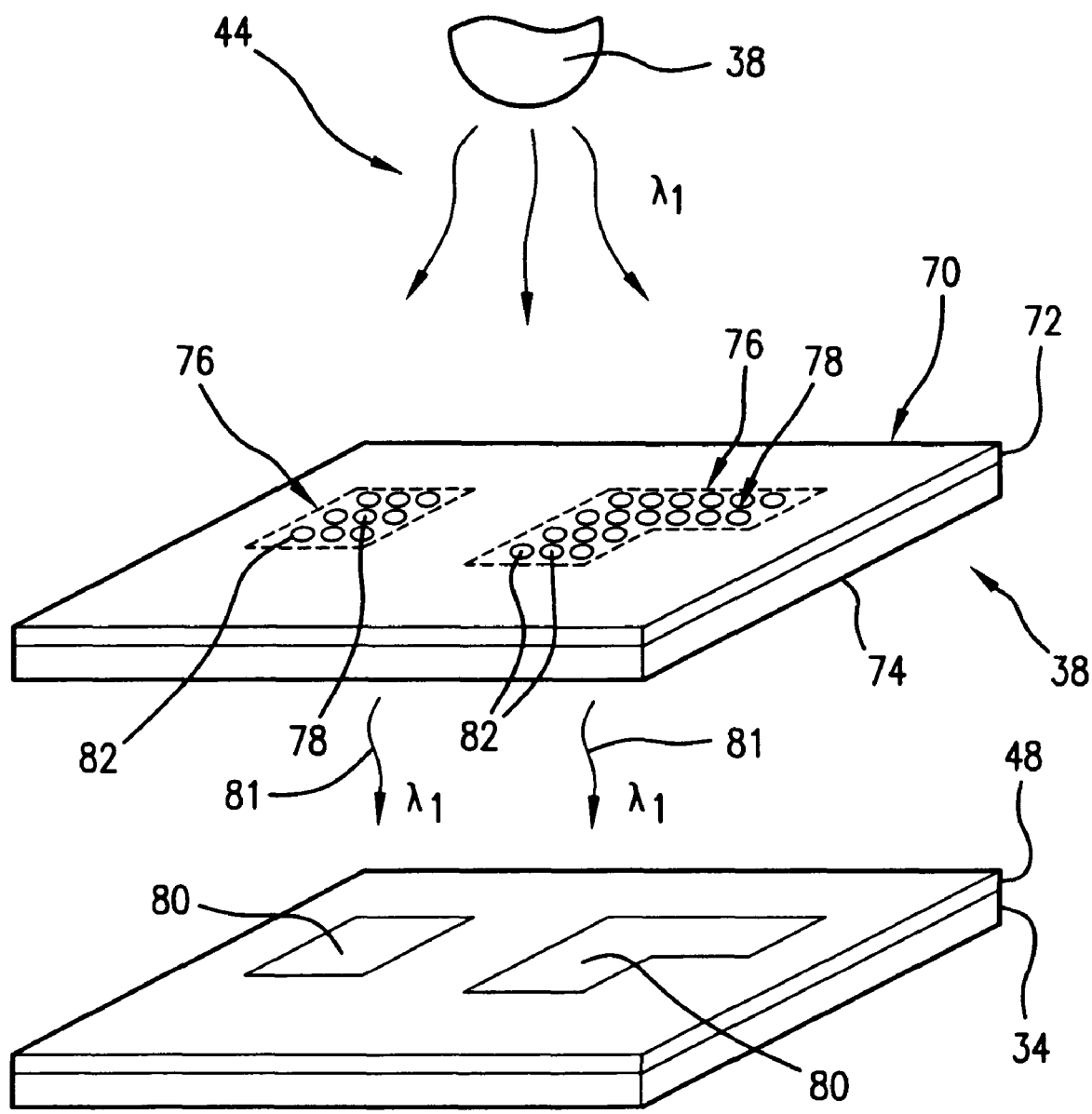
FIG. 5 is a simplified representation of the alternative stepper system of the present invention.

The stepper 30 of the present invention uses the mask 38 which, as shown in FIGS. 3-5 includes a mask plate (also referred to herein as a photo-plate) 70 formed as a layer 72 of an electrically conducting and optically opaque material, such as, for example, Ag, Al, or Cr, deposited on the mask substrate 74 fabricated from an optically transparent material, such as, for example, glass, quartz, etc. The layer 72 is preferably a thin layer having a predetermined thickness which can be milled through, for example, by a Focused Ion Beam (FIB), as will be described in further paragraphs, during an appropriate exposure time. As an example, the thickness of the opaque layer 72 may be chosen in the range of 100 nm. As shown in FIGS. 4 and 5, the mask 38 may be formed with a single or a plurality of pattern areas 76 in each of which an aperture array 78 is formed.

The layout of the mask 38, e.g. the number and the shape of pattern areas 76, location thereof on the mask plate 70, spacing therebetween, shape of the aperture array, spacing between the apertures, as well as the aperture sizes, etc., is fabricated based on the integrated circuit design, e.g., shape, size and disposition of features 80 to be imprinted on a wafer 34 in the photolithographic arrangement presented in a simplified form in FIG. 5.

In order to imprint the features 80, the wafer 34 is covered with a layer of a photoresist 48 which is exposed to radiation 81 exiting from the mask 38, where the same is exposed to the radiation of the wavelength λ emanating from the radiation source 64 and filtered by the optical filter 66 (shown in FIG. 3).

In the present stepper, the photoresist may coat any surface of use in semiconductor technology, including silicon, germanium, silicon-germanium alloys, compound semiconductors, insulating films such as nitrides or oxides or carbon or grapheme surfaces. Furthermore, this may include surfaces used to sustain pattern media such as is used in magnetic memory. It may also include micro-systems and nano-systems such as biological systems, that cannot be imaged with wavelengths shorter than 340 nm, because DNA breaks down with light shorter than this wavelength.

Although it is shown in FIG. 5, that the mask 38 has two pattern areas 76 of distinct shapes and with differently spread out apertures 82, it will be readily apparent to those skilled in the art that any number of the pattern areas 76, of similar or distinct shapes, with similar or distinct aperture arrays 78 therewithin, are contemplated in the scope of the present invention, subject to the design of the features and circuitry to be formed on the wafer 34.

Once the photoresist is exposed to the light 81 of the wavelength λ patterned in accordance with the mask image, the photoresist in the areas of exposure changes its chemical features. Positive photoresist becomes chemically less stable when exposed; while negative photoresist becomes more stable. The chemical change permits some of the photoresist to be removed by a "developer" solution. When exposed to the developer, the areas of the photoresist, for example, of the positive photoresist, which were not exposed to the light, are left on the substrate in correspondence with the mask image. The scanning exposure dose used in the stepper 30 may be used, for example, in the range of 675-900 mj for the plasmonic lithography.

In the following step, e.g. etching step, a liquid ("wet") or plasma ("dry") chemical agent removes the uppermost layer of the substrate in the areas that are not protected by photoresist thus forming elements of the integrated circuit to be formed in/on the substrate.

In the fabrication process of the mask 38, the electrically conducting film 72 is deposited on the mask substrate 74 formed from an optically transparent material. For example, a 100 nm thick Ag film 72 may be thermally evaporated on a 6×6 square inch quartz substrate 74. The mask substrate 74 with the silver film on the top of it is placed on a stage and is secured thereat by means known to those skilled in the art, for instance by a suction mechanism. The stage is capable of x-y-z reciprocation, as well as bidirectional rotational motion.

Although any "direct-write" technique is contemplated in the present arrangement for fabrication of the mask 38, as an example only, and not to limit the scope of the present invention, the Focused Ion Beam "writing" will be described further for simplification purposes.

The film 72 is exposed to a Focused Ion Beam (FIB) which mills substantially cylindrical apertures 82, sequentially—one after another, through the layer 72 to form the aperture array. Only the points at which apertures are to be formed, are exposed to the ion beam. The material between the points of the apertures is not exposed to the ion beam, and therefore is not milled away. Using this approach, e.g., addressing only the points of the apertures, permits a significant reduction of the "fill-factor" of the mask; and, as the result, reduces the mask "writing time". The stepper 30 using the mask 38 produced in this manner is more economical than conventional steppers.

The FIB system includes an ion source which generates an ion beam which further passes through ion beam optics which provides a focusing of the ion beam. The FIB lithography process uses a vacuum system (well known to those skilled in the art). The ion source may be a liquid metal source. Usually Ga is used which has a low melting point around 34° C., low thermal dispersion, low wave pressure, operation without heaters and lifetime above 1000 hours. This source is also compatible with high vacuum systems with radio single charged ions Ga+.

A controller controls the position of the stage with regard to the ion beam to provide the point-by-point scanning of the focused ion beam with regard to the layer 72 of the mask 38. The controller also controls the ion beam source operation to generate the ion beam sufficiently to mill the cylindrical apertures of a predetermined diameter through the entire thickness of the opaque layer 72. The predetermined diameter of the apertures may be in the range of about 100 nm, however, smaller diameters of the apertures are also contemplated in the masks if light sources of shorter wavelengths are used for feature exposures in the photolithography process. The aperture diameters may range from ½ to ⅓ of the light wavelength emanating from the radiation source 64 of the stepper 30 shown in FIGS. 3 and 5. The wavelength of the light 44 incident on the mask 38 may range, for example, from approximately 197 nm (and lower) to approximately 248 nm.

The ion beam size at the target (e.g. at the surface of the layer 72) is limited by the ion beam current, source size, and operation of electrostatic lenses in the ion beam optics. In the average, the FIB instruments have a focal spot size below 5 nm at a current of a few pA. However, an ion beam having a focal spot up to 50 nm may also be used to "drill" the apertures. For a given apparatus, milling times can be minimized by allowing the ion beam current to be as large as it can be without the diameter becoming too large to mill the desired size aperture. As an example, for a 50 nm diameter beam running at 10 picoamps the time required to drill through a 100 nm film is less than one third of a second. This is equivalent to having the beam directed at the located desired to drill until 3 picocoulombs of singly charged ions have been delivered. Practical resolution for the described system is in the range of a few tens of nanometers.

Alternatively, the electron beam "writing" of the mask may also be used for fabrication of the mask 38. However, in contrast to the FIB technique, electron beam "writing" contemplates a resist sputtering on the top of the layer 72 and imparting the pattern information to the layer 72 through the resist exposed to the electron beam. The FIB "writing" is applicable for rapid "mask writing" while e-beam "writing" uses an additional technological step (e.g., deposition of a resist layer on the layer 72), and therefore is more time consuming. Additionally, the FIB is advantageous over the electron beam technique in that it allows simultaneous observation of the treated surface. However, the disadvantage of the FIB lithography is a relatively low penetration depth and possible radiation damage which may occur in most cases of direct mask "writing".

Figure 6:
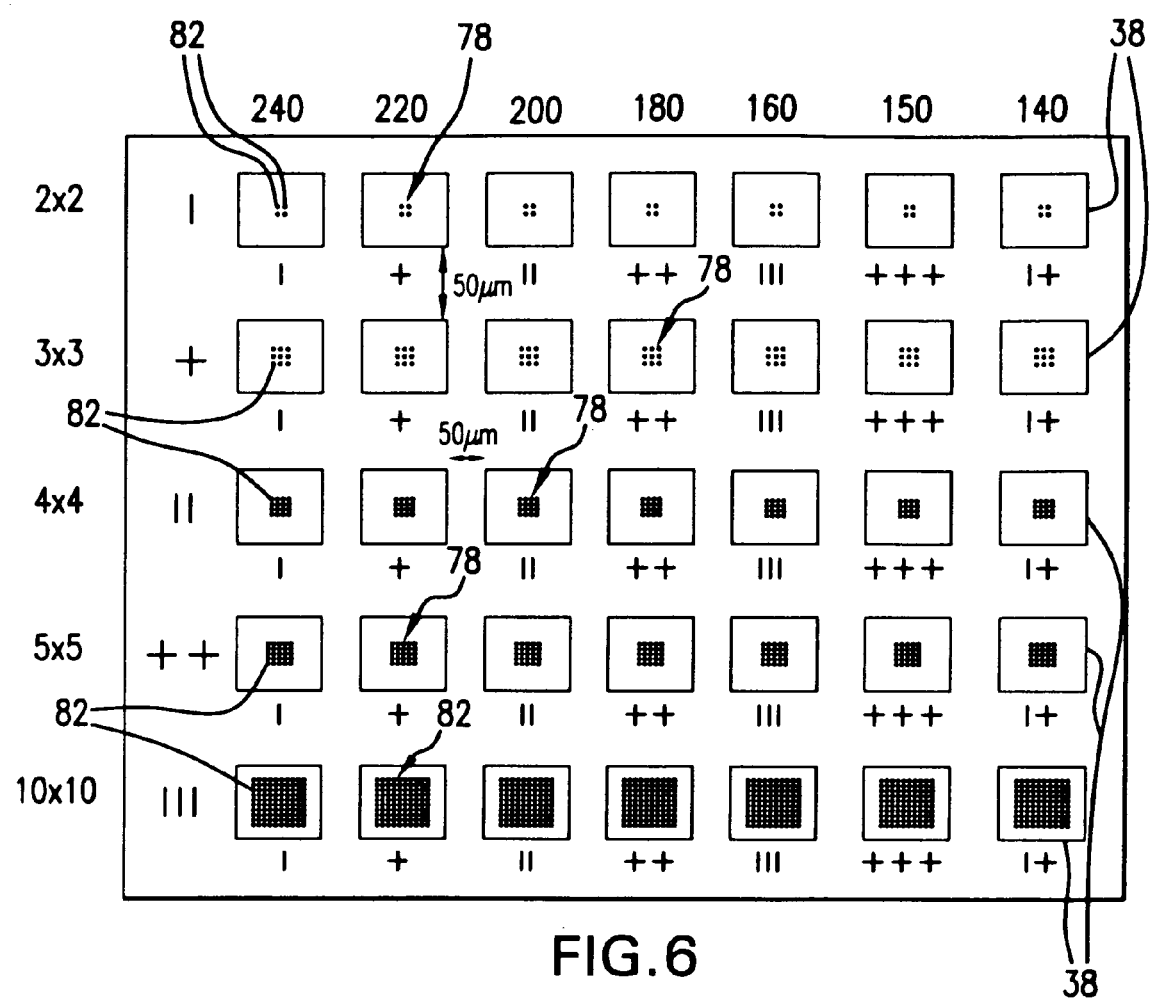
FIG. 6 represents schematically alternative mask layouts used in the stepper of the present invention.

The number of apertures 82 in each aperture array 78 milled in the electrically conductive opaque film 72 of the mask 38 may vary. In addition, the aperture spacing (center-to-center) between the milled apertures may also be varied. As an example, the spacing may vary in the range 140 nm-320 nm. For example, as shown in FIG. 6, the arrays having 2×2 through 10×10 apertures may be used in the stepper 30. The hole spacing may vary from 140-320 nm. The diameter of the milled apertures may be in the range of 100 nm or smaller, depending on the intended wavelength used in the stepper 30.

The scanning electron microscopy (SEM) images of four arrays are illustrated in FIGS. 7A-7D. FIG. 7A represents the image of the masks 38 with a 10×10 array of the apertures 82 with 320 nm hole spacing, while FIG. 7B shows a mask 38 with a 3×3 array with 280 nm hole spacing. The vertical slit-like appearance of the columns in the array in FIG. 7B is due to the astigmatism of the ion beam during the milling procedure. However, the exit aperture at the bottom of the metal film is circular.

FIGS. 7C and 7D demonstrate the modified masks 38 that may be used in the stepper to square up the projected image of the array on the wafer (photoresist) 34. These modifications, also referred to herein as correctional structures 84, are placed at each corner of the array of apertures 82 to improve the shape of the feature imprinted on the wafer as will be presented in further paragraphs. For example, in the mask shown in FIG. 7C, a single hole is placed in a diagonal manner at each corner of the array, while in the mask shown in FIG. 7D, a 3×3 array of holes is placed in each corner of the array.

The masks 38 were studied to explore the effects of aperture spacing, array size, as well as the influence of the correctional structures to improve image transfer fidelity. For this, a 248 nm mercury exposure (radiation) source was used for imaging the mask via the 4× stepper (for example ASML QML full field stepper configured for 0.25 μm resolution) on a 0.78 μm thick UV26 photoresist spun on a silicon wafer. The Micrascan II+QML™ (MSII+/QML) step- and scan is an affordable DUV (Deep Ultra-Violet) system for quarter micron lithography. The MSII+/QML is based on production proven Micrascan II+ technology, which provides performance, reliability and productivity in a 248 nm lamp based step-and-scan tool.

The MSII+/QML offers several important application dependant enhancements, including a specified resolution capability to 0.25 micron for isolated features, and a processing throughput of up to 60 wafers per hour for 200 mm wafers. With a low cost lamp exposure source and proven reliability, the MSII+/QML represents affordable choice for dependable lithography down to 0.25 micron processes.

The system has the following operational parameters:

| Lens | |
|---|---|
| Wavelength | 248 nm |
| NA | 0.50 |
| Resolution | 250 nm |
| Field size, for reticle with pellicle | |
| Max X | 22.0 mm |
| Max Y | 32.5 mm |
| CD uniformity @ 0.30 μm L/S | |
| Over 0.5 μm defocus: | ≦30 nm, 3σ |
| CD uniformity @ 0.25 μm isolated lines | |
| Over 0.5 μm defocus: | ≦30 nm, 3σ |
| Distortion (dynamic) | |
| Annular | ≦35 nm |
| Production Throughput | |
| 20 mJ/cm² exposure dose | |
| 200 mm wafers 36 shots: | ≦60 wph |
| Reticles (Masks) | |
| Reticle Size: | 6" × 6" × 0.25" thick |
| Pellicle standoff: | ≦5 mm, chrome side |
| Reticle library capacity: | 12² |
| Reticle bar code: | Intermec code 39 alpha numeric |
| Reticle change time | |
| ≦15 seconds first reticle | |
| ≦30 seconds all others | |

The results are also applicable to systems with higher numerical aperture (NA), allowing for extension to higher feature resolution. It is clear, that changing the exposure wavelength may affect the coupling of the incident beam to the plasmonic excitation modes. The exposure of the photoresist through the mask may be done at various foci and intensities of the light.

Figure 15:
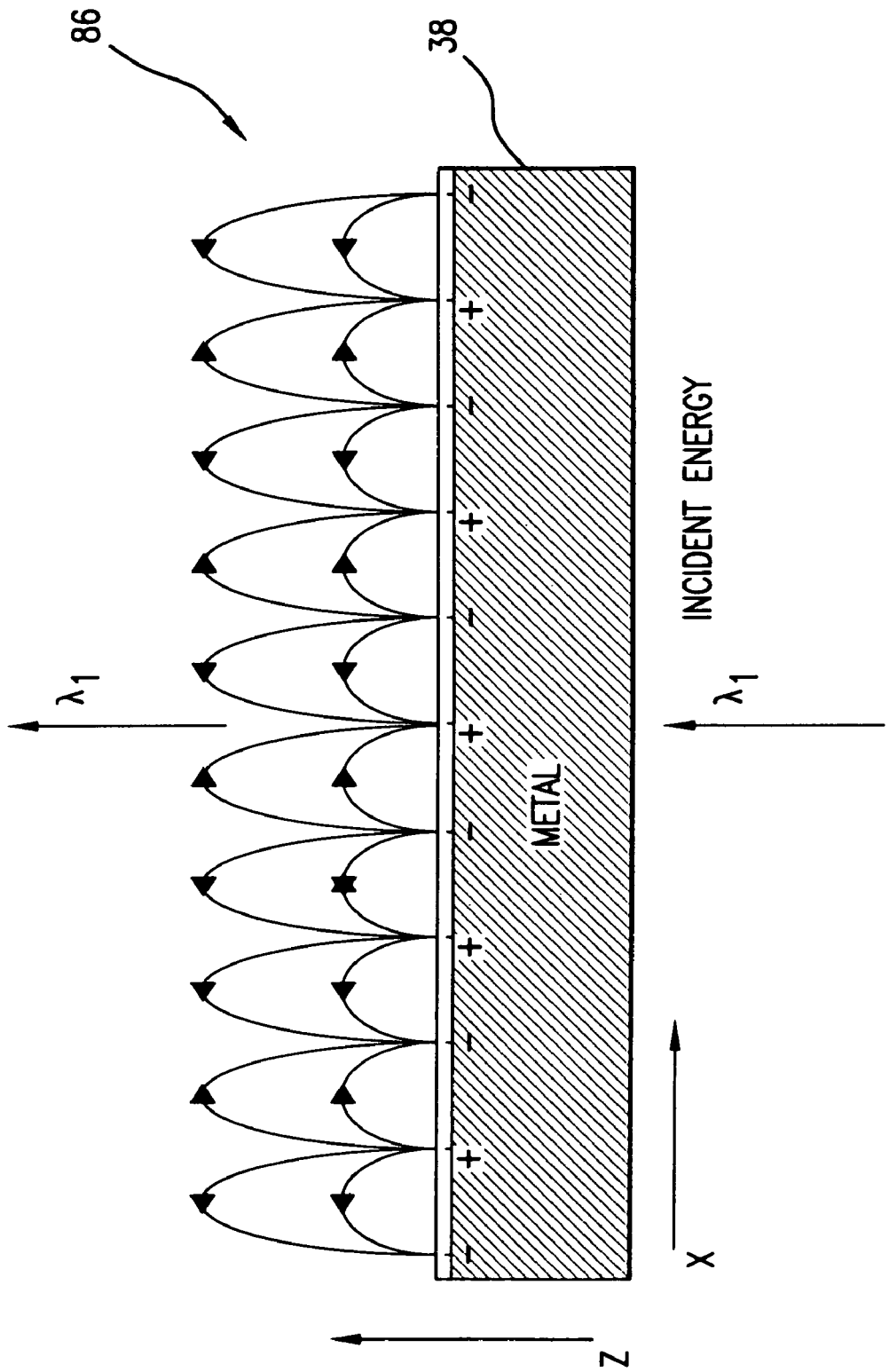
FIG. 15 is a simplified representation of the plasmonic effect occurring in the plasmonic mask employed in the stepper of the present invention.

The excitation wavelength corresponds to a charge excitation above the surface plasmon resonance. As shown in FIG. 15, the excited surface plasmons of a wavelength $\lambda_2$ much shorter than the wavelength $\lambda$ of the incident radiation 44 "carries" the excitation from the incident side of the mask 38 to the back side of the mask, forms an electromagnetic field 86 at the opposite side of the mask 38, and finally couples to free space radiation 81 of the wavelength $\lambda$. Contrary to the case of a free electron gas where a propagating mode would not exist at frequencies above the surface plasmon resonance, a real propagating mode is created in the metal (silver) film 72 of the mask 38 for frequencies above the surface plasmon resonance. For each hole spacing arrangement, the array 78 of holes 82 forms a feature 80 on the photoresist of a shape determined by the shape of the pattern area of the mask. For example, a square shaped feature 80 is formed on the wafer (photoresist) with the following equation describing the linear dimension, T, of the structure 80:

$$T=0.25[(x-1)d+D]$$ (Eq. 1)

where d represents the hole spacing, D is a diameter of the holes (100 nm or smaller), and x is the number of holes in a line of the square array, i.e., x=10 in a 10×10 array.

Once the mask is projected on the wafer coated with UV26 photoresist, the resulting patterns (features) 80 shown in FIG. 5 are captured via SEM images and measured. A measured dimension is compared to its expected value, T, also referred to as the nominal critical dimension (nominal CD), calculated using Eq. 1. The dimensions of the features imprinted on the wafer using the mask 38 may be attained which range from 45 nm to 500 nm and higher.

Figure 8A:
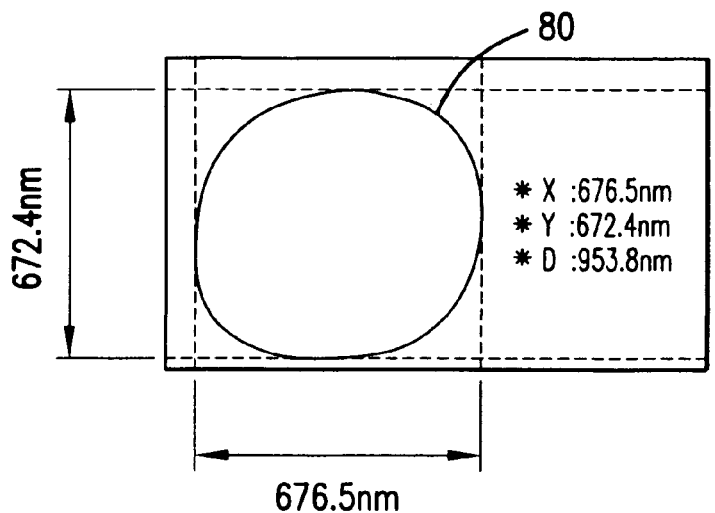
FIGS. 8A-8C are SEM images of the resolved pattern on the wafer (photoresist) in the stepper of the present invention.
Figure 8B:
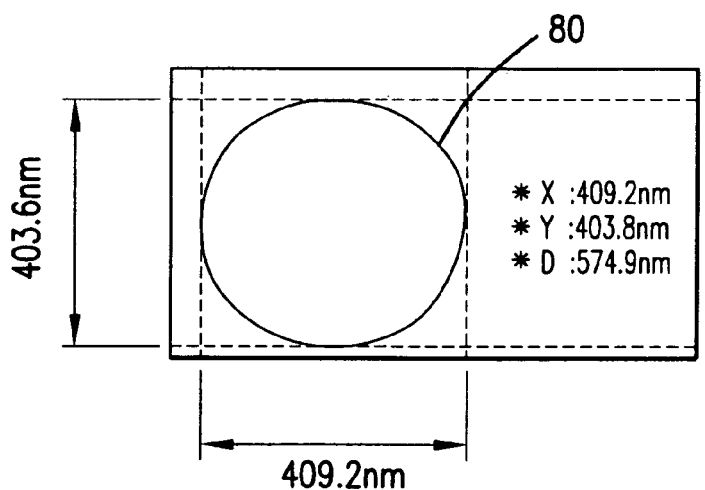
Figure 8C:
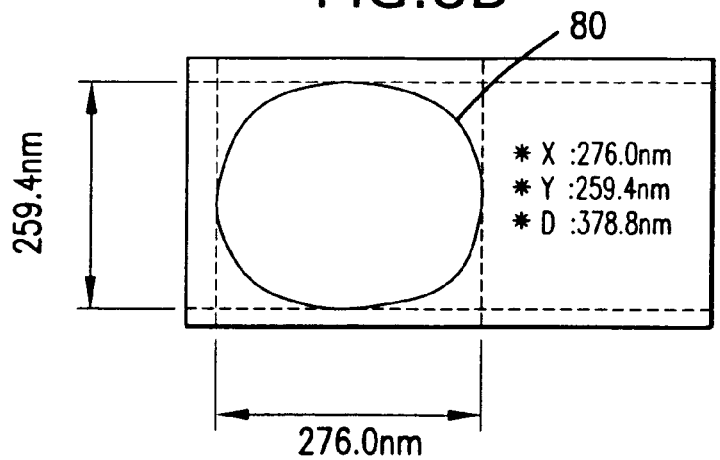

For example, for a 10×10 array with 300 nm hole spacing, the array size on the mask is 2.8×2.8 μm², with an expected 4× projected image of 0.7×0.7 μm², the SEM images of the resolved features 80 on the wafer are shown in FIG. 8A-8C. For FIG. 8A, where the 10×10 array with 280 nm hole spacing is used, nominally x, y is 655 nm, 655 nm. The obtained x, y is 676 nm and 672 nm respectively. For FIG. 8B, using the mask with 7×7 array with 260 nm hole spacing, the nominal x, y is 415 nm, 415 nm, and the obtained x, y is 409 nm, 403 nm, respectively. For FIG. 8C, using the mask with 5×5 array with 220 nm hole spacing, the nominal x, y is 255 nm, 255 nm, and obtained x, y is 280 nm, 260 nm, respectively. Thus, using a 248 nm radiation source 64 shown in FIGS. 3 and 5, the printed feature with the dimensions 260 nm is successfully imaged as shown in FIG. 8C.

Figure 9A:
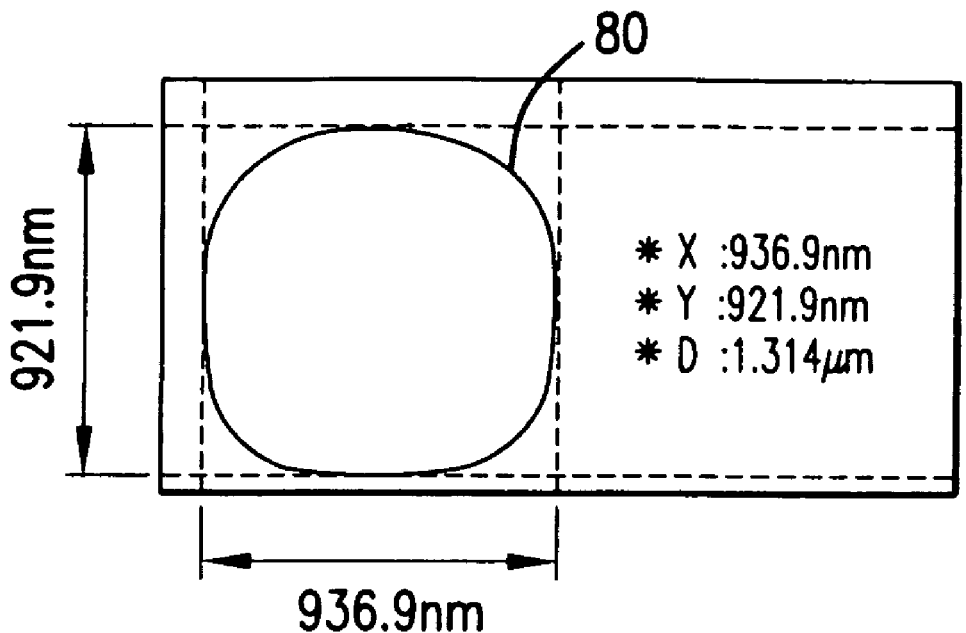
FIGS. 9A-9B are SEM images of resolved pattern on the wafer (photoresist) showing the effect of correctional holes on the edge acuity received by employing the arrays of FIGS. 7C and 7D, respectively.
Figure 9B:
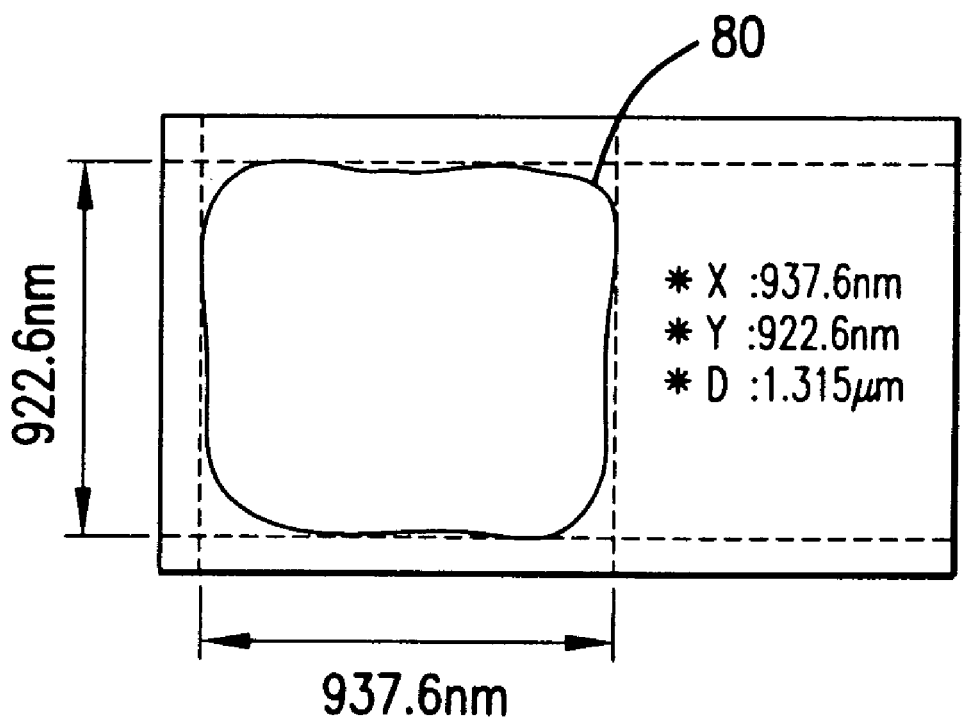

An attempt to sharpen the rounded corners of the resolved features shown in FIGS. 8A-8C, has been performed with the use of the masks 38 shown in FIGS. 7C and 7D, where the added correctional pixels (or matrices) 84 were implemented to fill in the corners of the aperture arrays. The addition of the correctional structures shown in FIG. 7D was successful in obtaining the squared corners of the imprinted features 80 on the wafer, e.g. the correctional structure 84 with the 3×3 array at the corners of the array improved feature linearity as may be observed in FIG. 9B. However, the pattern with a single correctional hole placed diagonal to each corner of the array edges shown in FIG. 7C had a very insignificant positive effect on squaring the corner as may be observed in the feature 80 shown in FIG. 9A.

Figure 10:
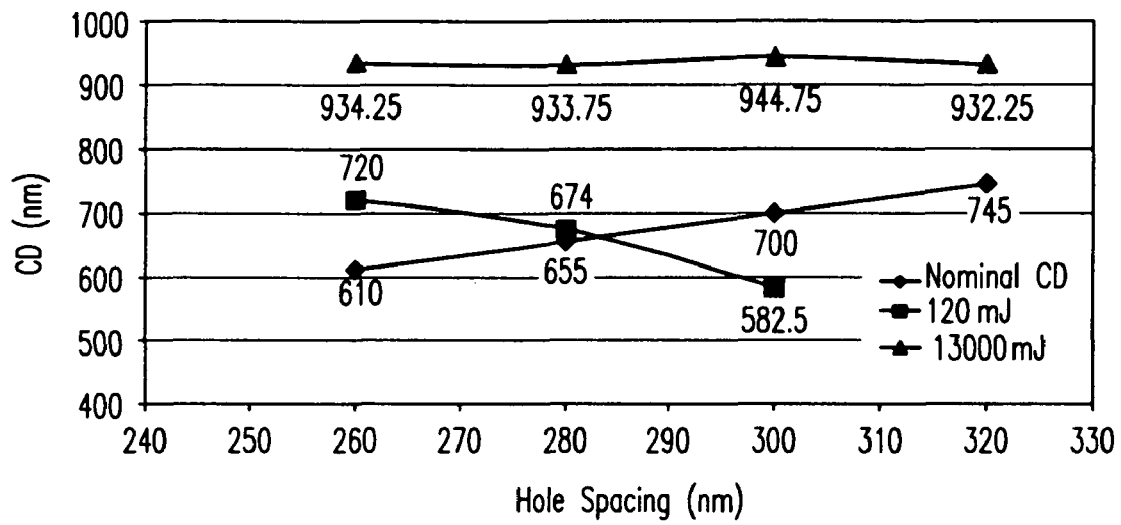
FIG. 10 is a diagram representing feature size vs. hole spacing at different radiation doses.

A study of the mask pattern stability as a function of exposure dose (e.g., the amount of light transmitted to the wafer through the mask) demonstrates the exposure system stability. As expected, the exposed feature size on the wafer (photoresist) increases and saturates as the applied exposure dose is increased. When a proper exposure dose is selected and used, the hole spacing and array sizes dictate the sizes of the exposed patterns. In other words, a match between the exposed feature sizes and the expected nominal CDs varies as a function of hole spacing and light dose as presented by the diagrams shown in FIG. 10.

Figure 11:
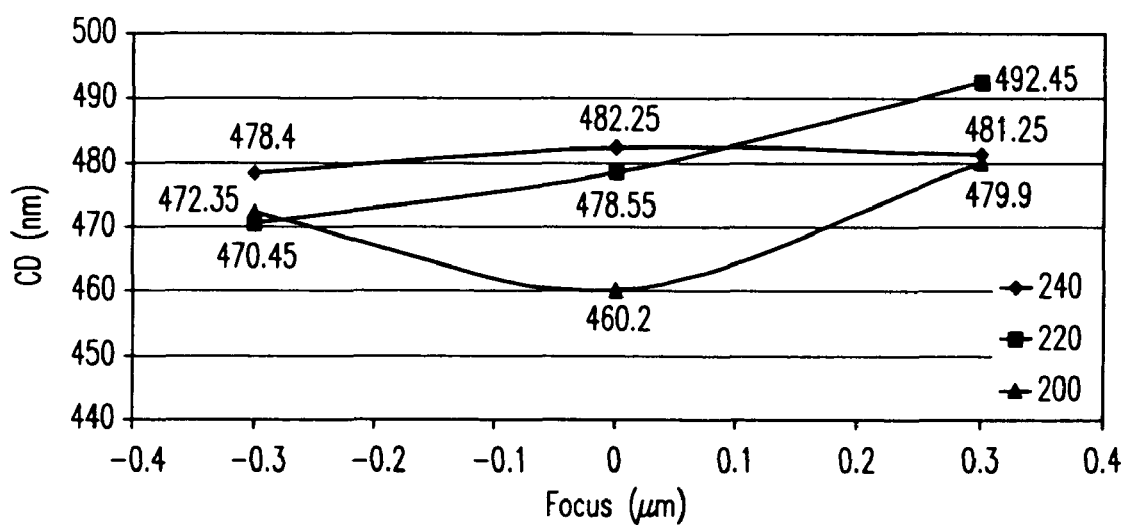
FIG. 11 is a diagram representing feature size vs. focus of 7×7 arrays with varying hole spacing.

The stability of the imaged pattern has also been studied by offsetting the image plane from its focused position. The mask is affected by focus offsets of the lens system. Changing the focus by +0.3 μm or −0.3 cm leads to changes in the size of the exposed features for different hole spacings, e.g., 200 nm, 220 nm, and 240 nm, as seen in FIG. 11.

Figure 12A:
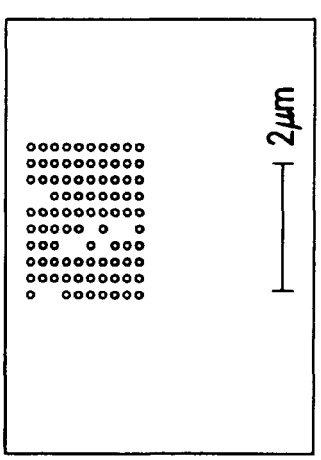
FIGS. 12A-12C are SEM images of 10×10 arrays with missing apertures.
Figure 12B:
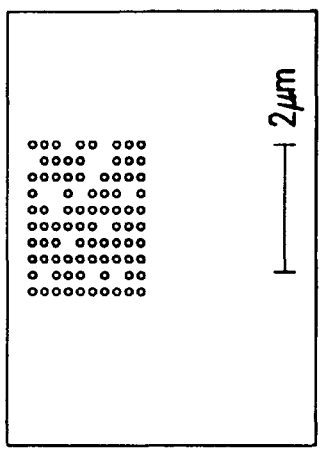
Figure 12C:
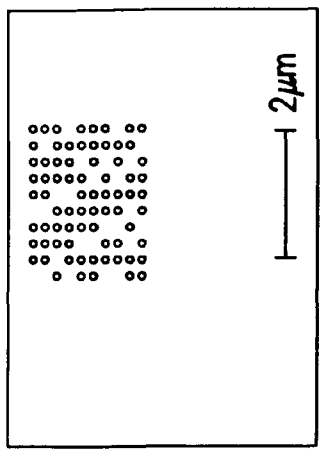

The collective nature of the electromagnetic excitation emanating from the mask apertures array was tested by omitting a set of random holes in the 10×10 arrays with 240 nm hole spacing to observe the defect tolerance of the mask. FIGS. 12A-12C show SEM images of the masks 38 with the arrays randomly missing 10, 20, and 30 apertures, respectively. These patterns were successfully fully exposed with no discontinuity, as presented in FIGS. 13A-13C for 10, 20, and 30 missing apertures, respectively. The dimensions of the resolved patterns 80 match favorably with expected (nominal) dimensions obtained from Eq. 1.

Figure 13A:
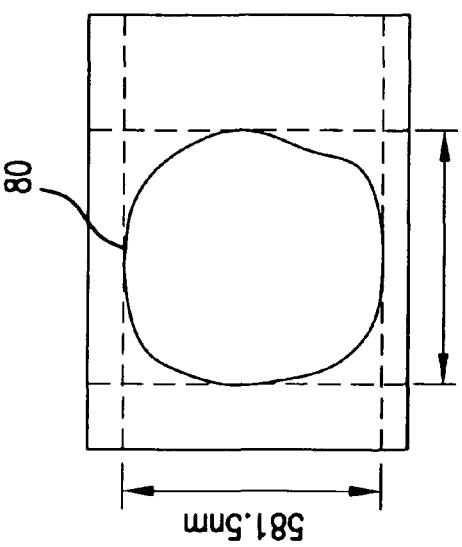
FIGS. 13A-13C are SEM images of the resolved pattern on the wafer corresponding to the masks presented in FIGS. 12A-12C, respectively.
Figure 13B:
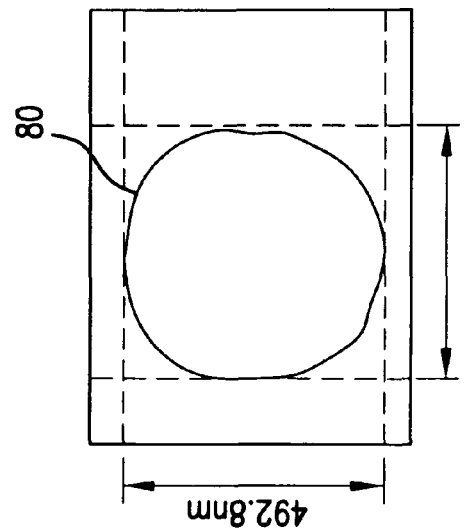
Figure 13C:
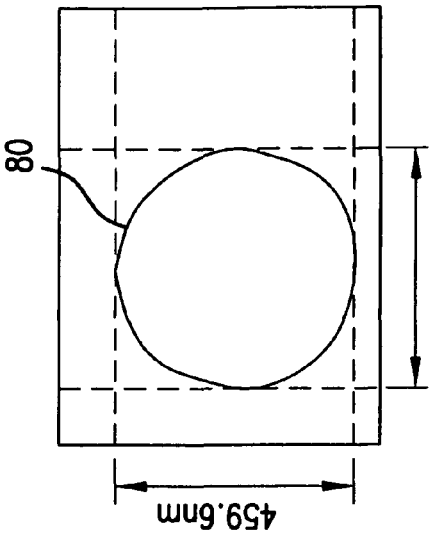

For FIG. 13A, the nominal x, y dimensions are 565, 565 nm; while the x, y dimensions for the resolved feature are 586, 581 nm, respectively. For FIG. 13B, the nominal x, y dimensions are 565, 565 nm; while the x, y dimensions are 495, 492 nm, respectively. For FIG. 13C, the nominal x, y dimensions are 565, 565 nm; while the x, y dimensions are 461, 460 nm, respectively.

While there was some slight deformation of the shape, no unexposed photoresist has been found in the resolved pattern on the wafer and, for the most part, the feature boundary size is quite close to that obtained from defect-free arrays. Some deformation is evident, but all the apertures were fully exposed and have been useful at the resolution limit of the tool employed. Again, it is emphasized that higher numerical aperture (NA) tools are expected to provide further improvement of the fidelity of the feature pattern transfer at smaller dimensions. However, a full improvement will require optimizing the sub-wavelength aperture spacing and the entire pattern diameter. The results presented in the previous paragraphs shows that the aperture array mask is based on a collective effect of the sub-wavelength apertures with a significant defect resiliency.

The masks 38 used in the stepper 30 have an optimized layout for each "shot" to be made on the wafer 34. The optimization is performed prior to loading the masks in the stepper; specifically, the optimization of the layout is carried out prior to and during the mask fabrication. A controller in the Focused Ion Beam arrangement, presented in previous paragraphs, translates the stage and controls the exposure regime of the ion beam source in accordance with the optimization parameters supplied to the controller from an optimization block which optimizes the mask layout (spacing and dimension of the apertures, as well as dimensions and shape of the apertures arrays), correlated with the exposure regime (exposure dose) for imprinting the features (elements) of the integrated circuit to be created on the wafer in accordance with the integrated circuit specifications. The optimization block sets the size, spacing and placement of the sub-wavelength apertures on the mask plate. As there is a considerable variation in optical material parameters, particularly in the case of metal opaque thin films for the mask plate, an empirical optimization approach may be used. For this, a computer graphics database (known to those skilled in the art) is sorted for key shapes for the features to be imprinted on the wafer. These key shapes are then assigned aperture spacings and diameters that have been shown to give optimum performance (such as resolution and time-to-expose) when fabricated individually.

Figure 14A:
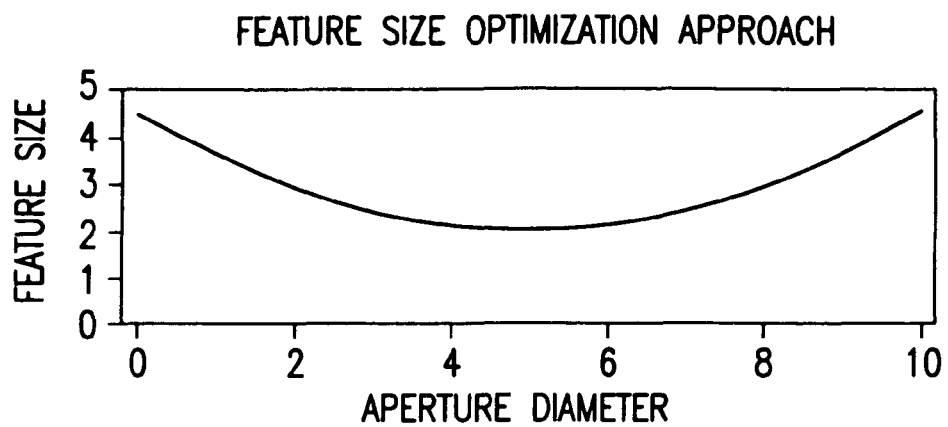
FIGS. 14A-14C are diagrams representing a feature size vs. aperture diameter, aperture spacing, and exposure dose, respectively, used in the mask parameters optimization.
Figure 14B:
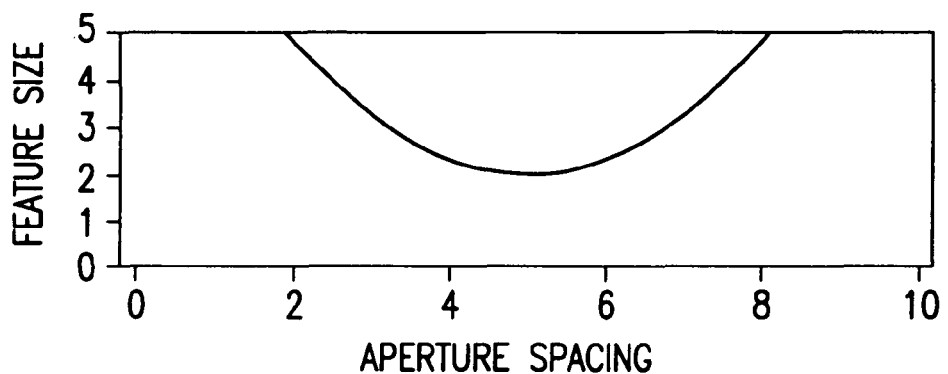
Figure 14C:
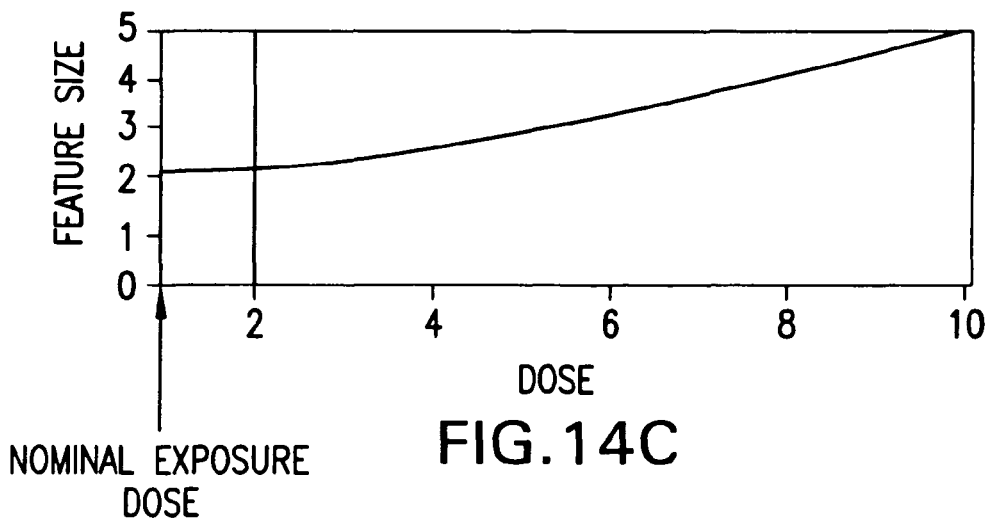

An example of this optimization approach for a basic shape of the imprinted feature may be further understood in conjunction with the diagrams presented in FIGS. 14A-14C. As shown FIGS. 14A and 14B, the aperture size and spacing is varied systematically, and the resulting masks are exposed to create the features of the feature size presented. The shortest exposure, yielding the best resolution, e.g., feature size closest to the target, is studied by the microscopic analysis (SEM) of the pattern developed in the photoresist on the wafer after it has been exposed to some nominal exposure dose.

Next, the pattern is exposed at a number of different exposure dose levels, as presented in FIG. 14C. If the slope of the feature size versus the exposure dose in the diagram presented in FIG. 14C is above a preferred slope in the vicinity of the nominal dose, the nominal dose is reset in an attempt to obtain a "flatter" curve. Once the satisfactory slope in vicinity of the nominal dose is obtained, the aperture size and spacing plots are re-run and the entire process iterated until a regime is found in which the desired feature size and minimum dose sensitivity are achieved. The feature size must be stable against exposure dose variation.

As a part of the optimization scheme, certain shapes in the sorted database may require further correction, such as the addition of "resolution enhancement features". An example would be "the squaring" of the features that initially (uncorrected) print as a circle. This is accomplished by adding the correctional structures as presented in FIG. 7D discussed in previous paragraphs.

It is a relatively easy task to sort the computer graphics pattern for each mask layer and to sort the resulting shapes by shape category. Most shapes in a given pattern will be large and will not need special lithographic considerations. Even these features may benefit from sub-wavelength exposure technology, as it will result in reduced "fill-factor", e.g. a reduced collective area to be addressed by the FIB on the mask plate. This reduced fill-factor for the manufacturing of the mask 38 used in the stepper 30 shown in FIG. 3 may significantly improve the throughput of the mask production, and therefore reduce the overall cost of the stepper system of the present invention.

Certain feature shapes, such as tightly spaced feature groupings, crosses or minimum dimension features, will require special consideration. They may require "boundary assist" correctional structures (such as presented in FIG. 7D, to achieve necessary pattern fidelity on transfer of the mask pattern to the wafer pattern. Those features which need simple adjustment of aperture size and spacing will have the appropriate correction accomplished in the graphics database on sorting. Those features amenable to special correction will be assigned corrections based on the discrete feature optimization described in the previous paragraphs. Advanced electromagnetic modeling codes may be used to further optimize the output.

When optimization of the mask layout is completed and the exposure regime for a particular circuit design is found, the optimization instructions are supplied to the controller in the mask fabrication scheme which in turn controls the stage translation/rotation and the ion beam source operational regime (exposure dose).

The mask 38 having arrays 78 of sub-wavelength apertures 82 may be used for far-field imaging, as shown by the study presented in previous paragraphs. The far-field emission through the mask is strong enough to pattern UV26 photoresist of 0.78 μm thickness. It is believed that plasmon excitation in the electrically-conductive film (such as, for example, formed from silver, or aluminum, or chromium) together with the localized excitation of the cavity modes due to the sub-wavelength apertures, is responsible for the transfer of the excitation from one side of the mask plate to the other side. An antenna-like effect takes place at the aperture openings on the back side of the mask, producing light radiation. When the apertures of the arrays subsequently radiate, there is a constructive interference between the apertures and transmission enhancement.

The study of the stepper system employing the mask 38 demonstrates that an array of sub-wavelength holes may be used to expose the photoresist on a wafer at 4× reduction. The presented approach was targeting 250 nm technology, given the limitations of the optical tools used. It is believed that this approach may be successfully applied for feature technologies in the range of 45-65 nm with the use of more powerful optical tools having higher numerical apertures and by optimizing the sub-wavelength aperture spacing and the size of the hole array.

In the stepper 30, shown in FIG. 3, the illumination systems, as well as the optical system, may be optimized to achieve maximum benefit from the plasmonic sub-wavelength apertured mask. For example, optical filter 66 may be adjusted to provide a light beam 44 of the wavelength optimal for the plasmonic excitation in the mask 30 for imprinting the features on the wafer of a sufficient quality. Further, the depth-of-focus in the stepper 30 may be increased by adjusting the position of the condenser lens 40 and/or of the mask 38 under the "supervision" of the controller 60 to keep the mask 38 sharply in focus. Further, the optical system of the stepper 30 may be improved by imaging the plane of the maximum plasmonic excitation through adjustments to the optical collimation (condenser lens 40) as well as to the reduction (projection) optics 42 and the pupil 46. The selection of optimal regimes may be through adjustment of the relative disposition of the lens and/or mask and/or wafer performed by the controller 60 as instructed by the computer 62.

It is contemplated in the stepper 30, that the photoresist 48 may be spin covered on the wafer 34 with the thickness in the range of 25%, 50% or 75% of the plasmonic field distribution depth (shown in FIG. 15) exiting the sub-wavelength apertures of the mask 30 and directed towards the wafer. The photoresist is preferably used having a substantially high sensitivity to the wavelength $\lambda$ of the created free space field 86 exiting the apertures of the mask.

Multiple successive lithographic exposures may be used on the same photoresist and wafer by scanning the focus field of the stepper system 30 and by successively imaging the plane of the highest plasmonic field onto the photoresist again through adjustment of the relative disposition between the elements of the stepper 30.

Further, pattern corner sharpening may be accomplished with resolution enhanced patterning. The use of superior optical tools will sharpen the corner rounding of exposed patterns as would be required for the next generation design rules. The dose required for optimal exposure may be less than 3× greater than a conventional dose.

The clear area of the exposure template for the pattern in the mask is significantly smaller than that required for "writing" on a conventional mask plate, since the transparent portion of the feature on the novel mask is an array of apertures with opaque spaces between the apertures. In the novel mask "writing", the exposing beam does not have to dwell on the regions between the individual sub-wavelength apertures. This leads to a significant improvement in the throughput in the masks fabrication and reduction of the cost of the entire stepper system using the mask 38.

The understanding of the phenomena which takes place when light travels through nano apertures is generally incomplete. However, it is suggested that the collective effect takes place in the novel mask 38 based on plasmonic interaction. The light of the wavelength $\lambda$ incident on the mask generates plasmon waves on the metal surface. These waves propagate in the plane of the mask. Further, when these waves encounter and are scattered at apertures in the metal film, they are transferred through the apertures. The waves further excite surface waves on the opposite side of the mask that can turn into freely propagating optical waves having the wavelength $\lambda$. These waves may be captured via the optics and they may be used to expose the photoresist as in the stepper 30 shown in FIG. 3.

The absence of up to 30% of the apertures still allows useful printing of the effected features. Neither individual resolved holes being printed nor any discontinuity in the exposed pattern has been observed. The image still exhibits good edge acuity and robustness against many of the normally encountered mask defects for the targeted 250 nm features.

The results demonstrate that in the stepper 30 integrated with the mask 38, the 2-dimensional array 78 of sub-wavelength apertures 82 may be used to expose the photoresist 48 with the same resolution as with a clear aperture mask of the same size as the array, may require a slightly longer exposure time. Therefore, this discovery points to modifications in conventional steppers, e.g. using photolithographic masks with a writing time potentially reduced by some fraction of the fill-factor of the array. As stated above, the actual exposure throughput improvement may be determined by the final address structure of the "writing" beam tool and the number of addressed apertures required to establish a distribution intensity resonance that reflects the desired shape and dimension. It is believed that some reductions in write time are possible and a significant reduction in "write" time is attained. For this approach to be applied to state of the art design rules (45 nm, 65 nm) may necessitate the use of higher NA optical tools and the optimization of the sub-wavelength aperture spacing and the array size.

Although this invention has been described in connection with specific forms and embodiments thereof, it will be appreciated that various modifications other than those discussed above may be resorted to without departing from the spirit or scope of the invention as defined in the appended Claims. For example, equivalent elements may be substituted for those specifically shown and described, certain features may be used independently of other features, and in certain cases, particular applications of elements may be reserved or interposed, all without departing from the spirit or scope of the invention as defined in the appended Claims.

What is being claimed is:

1. A stepper system for far-field ultra-high resolution photolithography, comprising:

an illumination system generating light of a predetermined wavelength $\lambda$;

a photolithographic mask, said photolithographic mask including a mask photo-plate formed with a layer of an electrically conducting optically opaque material on a mask substrate, at least one pattern area being defined at a predetermined location of said layer, said at least one pattern area containing an array of apertures, each aperture having a predetermined size in the range below said predetermined wavelength $\lambda$, and being spaced each from another a predetermined spacing distance, wherein a plasmonic excitation is generated in said array of apertures to produce far-field radiation patterns;

a wafer stage, a wafer covered with a photosensitive material being secured to said wafer stage, wherein said wafer is spaced from said photolithographic mask at an adjustable distance;

a reduction lens positioned between said photolithographic mask and said wafer; and a controller unit operatively coupled to said illumination system, said reduction lens, said photolithographic mask, and said wafer to adjust a relative disposition between said photolithographic mask, said reduction lens and said wafer to image a plane of maximum plasmonic excitation generated at said photolithographic mask, thereby exposing said photosensitive material on said wafer to the far-field radiation patterns of a sufficient intensity to expose said photosensitive material;

wherein said light is incident on said photosensitive material on the wafer through said photolithographic mask to transfer a pattern formed in said layer of said electrically-conductive material of said photolithographic mask to said photosensitive material to imprint at least one feature thereat corresponding to said at least one pattern area of said photolithographic mask, and wherein dimensions of said at least one feature imprinted on said photosensitive material are smaller than dimensions of a corresponding said at least one pattern area defined at said layer of said photolithographic mask.

2. The stepper system of claim 1, further comprising an optical system including a condenser lens positioned between said illumination system and said mask.

3. The stepper system of claim 1, further comprising a wafer alignment system coupled between said controller unit and said wafer stage.

4. The stepper system of claim 1, further comprising a mask alignment system coupled between said controller unit and said photolithographic mask.

5. The stepper system of claim 1, wherein said illumination system includes a broadband mercury light source and a narrowband optical filter between said light source and said photolithographic mask to produce the light of said wavelength $\lambda$.

6. The stepper system of claim 1, wherein a layer of said photosensitive material ranges between 25% and 75% of a plasmonic field distribution depth exiting said apertures of said photolithographic mask.

7. The stepper system of claim 1, wherein said array of apertures constitutes an A×B matrix of the apertures, wherein A=2, 3, . . . , 10, . . . , N, and wherein B=2, 3, . . . , 10, . . . , N.

8. The stepper system of claim 1, wherein said photo-plate further includes at least another pattern area located a predetermined distance from said at least one pattern area.

9. The stepper system of claim 8, wherein said arrays of apertures in said at least one and at least another pattern area are substantially identical.

10. The stepper system of claim 8, wherein said at least another pattern area contains an array of apertures spread out in a predetermined order distinct from said array of apertures in said at least one pattern area.

11. The stepper system of claim 8, wherein the predetermined size of said apertures in said at least another pattern area is distinct from the predetermined size of said apertures in said at least one pattern area.

12. The stepper system of claim 8, wherein the apertures in said at least another pattern area are spaced each from another a distance different than said predetermined spacing distance between the apertures in said at least one pattern area.

13. The stepper system of claim 1, wherein said wavelength $\lambda$ is in the range of 197 nm-248 nm.

14. The stepper system of claim 1, wherein said predetermined spacing distance falls in the range of approximately from 140 nm-320 nm.

15. The stepper system of claim 1, wherein said predetermined size of said apertures is approximately in the range from $\frac{1}{3}$ to $\frac{1}{2}$ of said wavelength $\lambda$.

16. The stepper system of claim 1, wherein said electrically-conducting optically opaque material of said photoplate is selected from the group of materials consisting of: Ag, Al, Cr.

17. The stepper system of claim 1, wherein dimensions of said at least one feature imprinted at the wafer is in the range of 45 nm-500 nm.

18. A method for imaging features on a wafer in a far-field nano-lithography stepper system, comprising the steps of:

generating light from a light source, said light having a wavelength $\lambda$, installing a photolithographic mask in said stepper system, said photolithographic mask including a layer of an electrically conducting optically opaque material perforated to form at least one array of apertures extending through said layer and having a diameter d<$\lambda$, said at least one array defining at least one pattern area on said photolithographic mask, exposing a front side of said photolithographic mask to said light thereby producing far-field radiation at a back side of said photolithographic mask, exposing a photoresist layer on the wafer to said far-field radiation of a sufficient intensity to expose said photoresist layer in accordance with said at least one pattern area defined on said photolithographic mask, positioning a first optical unit between said photolithographic mask and said photoresist and a second optical unit between said light source and said mask, and controlling said first and second optical units to adjust a relative disposition between said photolithographic mask and said wafer to increase a depth-of-focus of said stepper system and for imaging a plane of a maximum plasmonic excitation field of said photolithographic mask onto said photoresist layer.

19. The method of claim 18, wherein said photoresist has a sufficient sensitivity to a free space wavelength $\lambda$, following coupling of said plasmonic excitation field and reemission of the wavelength $\lambda$, and wherein the thickness of said photoresist layer ranges between 25% and 75% of the plasmonic excitation field depth.

* * * * *